(12) United States Patent  
Breymesser et al.

(10) Patent No.: US 9,390,883 B2  
(45) Date of Patent: Jul. 12, 2016

(54) IMPLANTATION APPARATUS WITH ION BEAM DIRECTING UNIT, SEMICONDUCTOR DEVICE AND METHOD OF MANUFACTURING

(71) Applicant: Infineon Technologies AG, Neubiberg (DE)

(72) Inventors: Alexander Breymesser, Villach (AT); Stephan Voss, Munich (DE); Hans-Joachim Schulze, Taufkirchen (DE); Werner Schustereder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 88 days.

(21) Appl. No.: 14/177,910

(22) Filed: Feb. 11, 2014

(65) Prior Publication Data

US 2015/0228446 A1   Aug. 13, 2015

(51) Int. Cl.
*H01J 37/147* (2006.01)
*H01J 37/20* (2006.01)
*H01J 37/317* (2006.01)
*H01L 29/06* (2006.01)
*H01L 29/744* (2006.01)
*H01L 29/45* (2006.01)

(52) U.S. Cl.
CPC ............ *H01J 37/1477* (2013.01); *H01J 37/20* (2013.01); *H01J 37/3171* (2013.01); *H01L 29/0615* (2013.01); *H01L 29/0657* (2013.01); *H01L 29/744* (2013.01); *H01J 2237/20214* (2013.01); *H01L 29/45* (2013.01)

(58) Field of Classification Search
USPC ................. 438/499, 514, 527; 257/E21.334, 257/E21.337, E29.109
See application file for complete search history.

(56) References Cited

U.S. PATENT DOCUMENTS

2006/0211226 A1* 9/2006 Rouh ................. H01L 21/265  
  438/514  
2007/0215981 A1* 9/2007 Schulze ............. H01L 29/0696  
  257/591

OTHER PUBLICATIONS

Okamoto, et al. "MIND+ system; More universal dose patterns by single-step ion implantation." AIP Conference Proceedings 1496, Jun. 2012. Valladolid, Spain. pp. 1-3.

Ninomiya, et al. "MILD system: Maskless implantation for local doping." AIP Conference Proceedings 1496, Jun. 2012. Valladolid, Spain. pp. 1-3.

Krueger, et al. "Acheiving Uniform Device Performance by Using Advanced Process Control and SuperScan." AIP Conference Proceedings 1321, Jun. 2010. Kyoto, Japan. pp. 1-3.

* cited by examiner

*Primary Examiner* — Kiet T Nguyen  
(74) *Attorney, Agent, or Firm* — Murphy, Bilak & Homiller, PLLC (57) ABSTRACT

An ion implantation apparatus includes an ion beam directing unit, a substrate support, and a controller. The controller is configured to effect a relative movement between an ion beam passing the ion beam directing unit and the substrate support. A beam track of the ion beam on a substrate mounted on the substrate support includes circles or a spiral.

7 Claims, 8 Drawing Sheets

IMPLANTATION APPARATUS WITH ION BEAM DIRECTING UNIT, SEMICONDUCTOR DEVICE AND METHOD OF MANUFACTURING

BACKGROUND

Ion implanters with high current accelerator systems and ion beam currents of more than 2 mA emit ion beams with a diameter of several centimeters. Several semiconductor substrates may be mounted on a substrate carrier that rotates during the ion implant. Ion implanters with medium current accelerator systems and ion beam currents of about 1 mA emit ion beams with a diameter of about 1 cm. An electrostatic deflection system deflects the ion beam along two orthogonal scan directions. For implanting impurities in a semiconductor substrate the ion beam linearly scans the semiconductor substrate along parallel lines or zig-zag paths. The implant dose may be locally modified by omitting lines or the line feed for one or more linear scans or by varying the scan speed.

There is a need for improving ion implanters and the methods of ion implanting.

SUMMARY

According to an embodiment an ion implantation apparatus includes an ion beam directing unit, a substrate support, and a controller. The controller is configured to effect a relative movement between an ion beam passing the ion beam directing unit and the substrate support wherein a beam track of the ion beam on a substrate mounted on the substrate support includes circles or a spiral.

According to another embodiment an ion implantation method includes directing an ion beam onto a substrate and controlling a relative movement between the ion beam and the substrate such that a beam track of the ion beam is a spiral or a circle around a center point of the substrate.

According to a further embodiment a semiconductor substrate includes a circular wafer-scale semiconductor body and in the semiconductor body a circular implant zone with a radial variation of doping around a center point of the semiconductor body.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^−$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
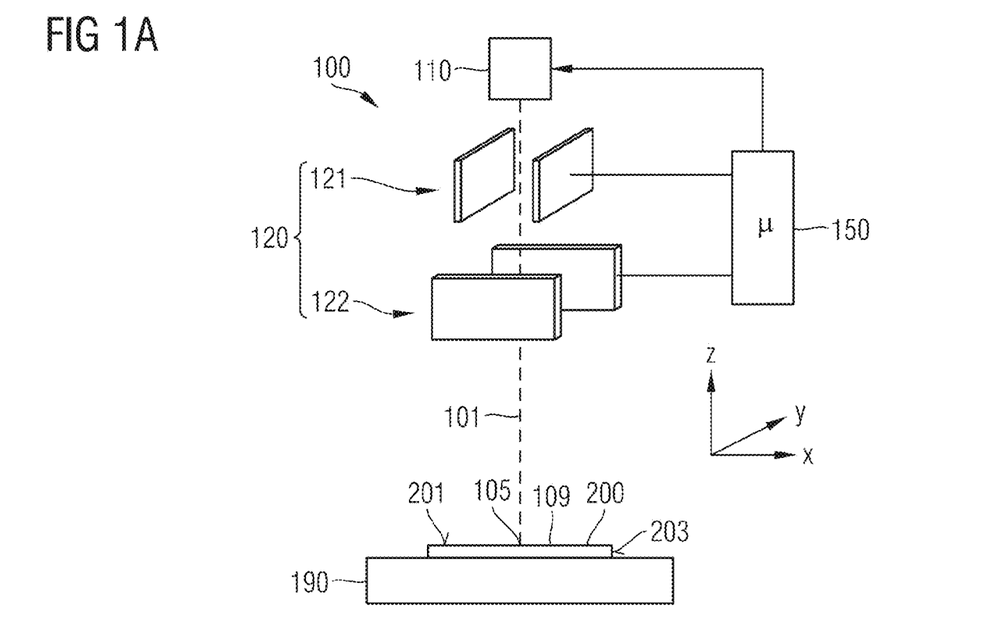
FIG. 1A is a schematic diagram illustrating an ion implantation apparatus according to an embodiment providing electrostatic deflection units for two lateral directions.

The ion implantation apparatus 100 in FIG. 1A includes an ion beam source 110 emitting an ion beam 101. The ion beam source 110 may include an ion source emitting the desired ions, for example protons, helium, donator or acceptor ions such as boron ions, phosphorus ions or arsenic ions, by way of example. The ion beam source 110 may further include an accelerator electrostatically accelerating the ions emitted by the ion source, a separation magnet for removing undesired impurity ions and a lens unit for focusing the ion beam 101. According to an embodiment a diameter of the ion beam 101 is between 0.5 and 2.5 cm.

The ion implantation apparatus 100 further includes an ion beam directing unit 120 including a first deflection unit 121 for deflecting the ion beam 101 along a first lateral direction (x-axis) and a second deflection unit 122 for deflecting the ion beam 101 along a second lateral direction (y-axis) which may be orthogonal to the first lateral direction. Each of the deflection units 121, 122 may deflect the ion beam symmetrically with respect to a center position of the ion beam 101.

A substrate support 190 fixes a substrate 200 such that a center point 105 of the substrate 200 is arranged in the center position of the ion beam 101.

The substrate 200 may be a circular substrate, for example a standard semiconductor wafer with any diameter, e.g. at least 25.4 mm. The semiconductor wafer may be a silicon wafer, an SOI (silicon-on-insulator) wafer, e.g., an SOG (silicon-on-glass) wafer, or a substrate of another single-crystalline semiconductor material such as silicon carbide SiC, gallium arsenide GaAs, gallium nitride GaN, any other $A_{III}B_V$ semiconductor, germanium Ge or a silicon-germanium crystal SiGe, by way of example. According to another embodiment, the substrate 200 may be a disc-shaped substrate cut out from a semiconductor wafer, e.g. by a laser beam The substrate support 190 may align the substrate 200 such that an exposed process surface 201 of the substrate 200 is perpendicular to the ion beam 101 in its center position. According to other embodiments, the substrate 200 is tilted to the ion beam in its center position by at most 10 degree, for example by about 7 degrees.

A controller 150 is coupled to the ion beam directing unit 120 and controls the deflection of the ion beam 101 to effect a relative movement between the ion beam 101, which passes the ion beam directing unit 120, and the substrate support 190 such that a beam track 109 of the ion beam 101 on the process surface 201 is a spiral or includes circles. For example, the controller 150 may be electrically connected or coupled to the first deflection unit 121 and to the second deflection unit 122 and effects a modulation of a deflection voltage applied to the first and second deflection units 121, 122 in an appropriate way.

Figure 1B:
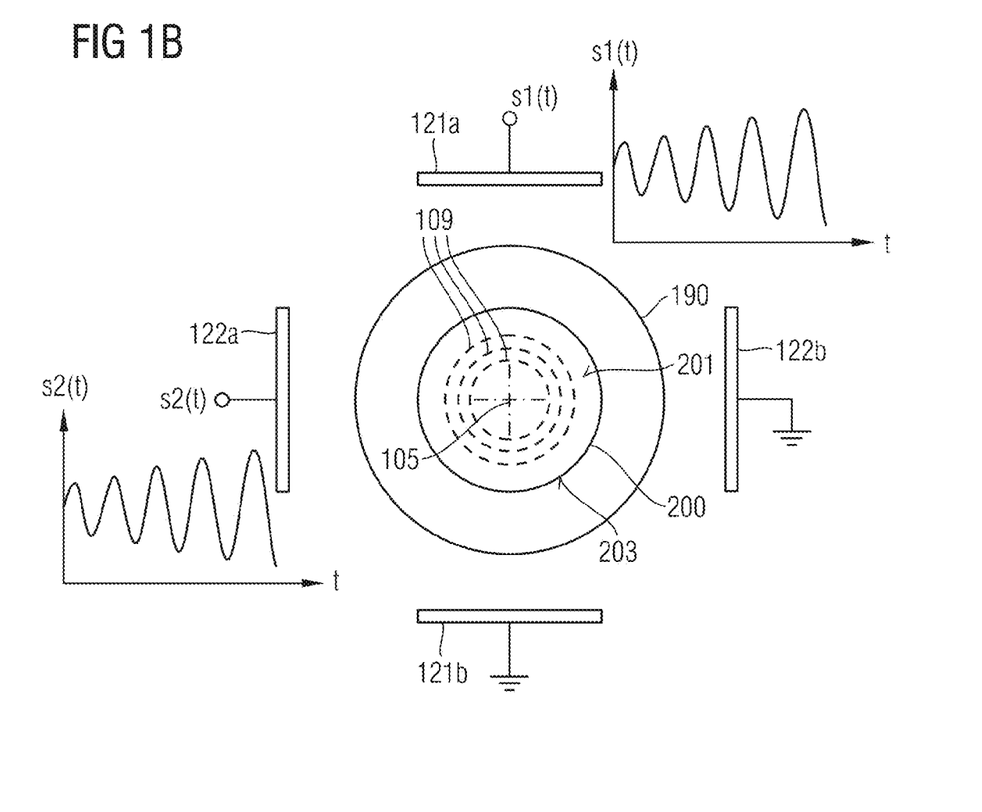
FIG. 1B is a schematic plan view of a substrate according to an embodiment with an ion beam track on the substrate including concentric circles.
Figure 1C:
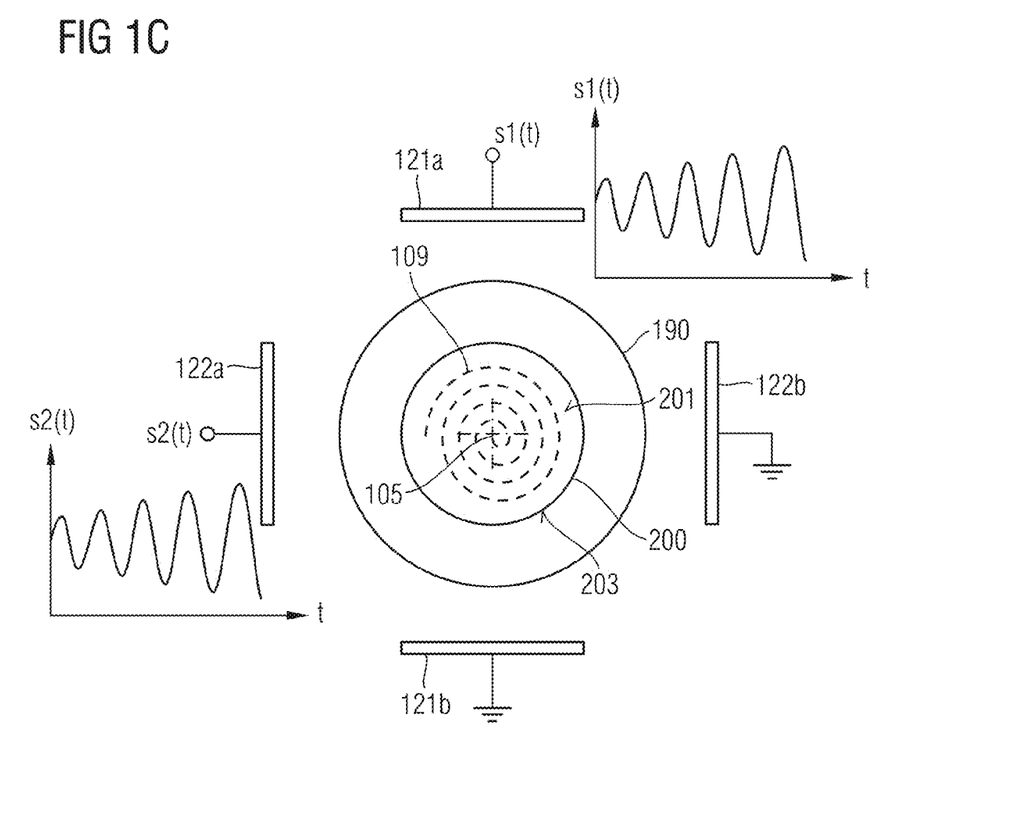
FIG. 1C is a schematic plan view on a substrate according to an embodiment with an ion beam track on the substrate including a spiral.

As illustrated in FIGS. 1B and 1C each of the deflection units 121, 122 may include two deflection plates 121a, 121b, 122a, 122b on opposing sides of the ion beam 101, respectively. The control unit 150 may apply a first deflection signal s1(t) to the first deflection unit 121 and a second deflection signal s2(t) to the second deflection unit 122. According to the illustrated embodiment the first deflection signal s1(t) is applied to a first deflection plate 121a of the first deflection unit 121 and the second deflection signal s2(t) is applied to the first deflection plate 122a of the second deflection unit 122, whereby the second deflection plates 121b, 122b are grounded. According to other embodiments the controller unit 150 may apply differential deflection signals to both deflection plates of each deflection unit 121, 122.

The amplitudes of the two deflection signals s1(t), s2(t) may fluctuate around mean values defining a center position of the ion beam 101. The two deflection signals s1(t), s2(t) may be sinusoidal signals, which may have the same frequency and which may be phase-shifted to each other by Π/2 such that the ion beam follows the surface of a cone and for each complete oscillation the ion beam 101 surrounds the center point 105 once between the center point 105 and a lateral area 203 tilted to the process surface 201. The amplitudes of the two deflection signals s1(t), s2(t) determine the distance of the circulation to the center point 105.

According to an embodiment with the process surface 201 perpendicular to the ion beam 101 in its center position the amplitudes of the two deflection signals s1(t), s2(t) may be equal such that for each complete oscillation the beam track 109 on the process surface 201 is a circle. According to embodiments with the process surface 201 tilted to the ion beam 101 in its center position the amplitude ratio of the two deflection signals s1(t), s2(t) may be adjusted in a way such that the beam track 109 includes circles around the center point 105.

For achieving a homogeneous implant dose across the process surface 201 the amplitudes of the deflection signals s1(t), s2(t) may be varied proportional to 1/r at a fixed amplitude ratio, with r indicating the distance of the ion beam 101 to the center point 105 on the process surface 201. Starting from deflection signals for homogeneous implant doses rotational-symmetric, e.g., circular implantation profiles may be obtained by modifying, at the same implant current, the frequency of the first and second deflection signals s1(t), s2(t) resulting in a modification of the implant dose along the beam track 109, or by modifying, at the same amplitude ratio, the amplitude gradient of the deflection signals s1(t), s2(t) resulting in a radial modification of the density of circulations of the beam track 109, by way of example.

According to the embodiment of FIG. 1B the amplitudes of the deflection signals s1(t), s2(t) are constant during one or more complete circulations and are simultaneously changed, at the same amplitude ratio, after the beam track 109 has completed one or more complete circulations. The beam track 109 includes circles of different diameters and the impurity distribution is circular. According to another embodiment the frequency of both deflection signals s1(t), s2(t) may vary for only a portion of a circle such that the implant dose varies along the beam track 109.

According to the embodiment of FIG. 1C the controller 150 of FIG. 1A steadily increases the amplitudes of both deflection signals s1(t), s2(t) such that the beam track 109 of the ion beam 101 on the process surface 201 is a spiral. The controller 150 may control the deflection units 121, 122 such that the beam track 109 winds inwardly or outwardly. The beam track 109 may cross the whole substrate 200 between the center point 105 and a lateral area 203 or a portion thereof. The frequency of both deflection signals s1(t), s2(t) may vary for only a portion of a circulation such that the implant dose varies along the beam track 109.

Figure 1D:
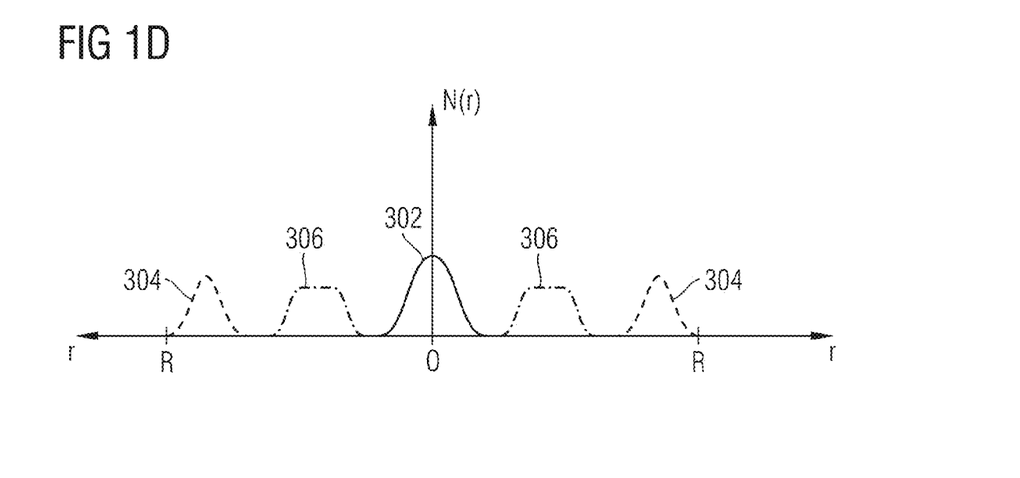
FIG. 1D is a schematic diagram illustrating circular impurity profiles according to embodiments.

FIG. 1D shows impurity concentration profiles in the semiconductor substrate 200 which can be obtained by using the ion implantation apparatus 100 of FIG. 1A. For profile 302, the beam track 109 crosses only an inner portion including the center point 105, for profile 304 the beam track 109 crosses an outer portion along the lateral area 203 and for profile 306 a ring portion distant to both the center point 105 and the lateral area 203. The ion implantation apparatus 100 is adapted to form rotational-symmetric, e.g., circular impurity regions and a variation of doping along circles or a spiral.

Where for circular impurity profiles conventional ion implanters performing linear line-by-line scanning along the x-axis or along zig-zag paths require rather complex and time-consuming programming steps for locally varying the implant dose by modifying the scans, the ion implantation apparatus 100 achieves a similar effect at less effort and with better local resolution.

Figure 2A:
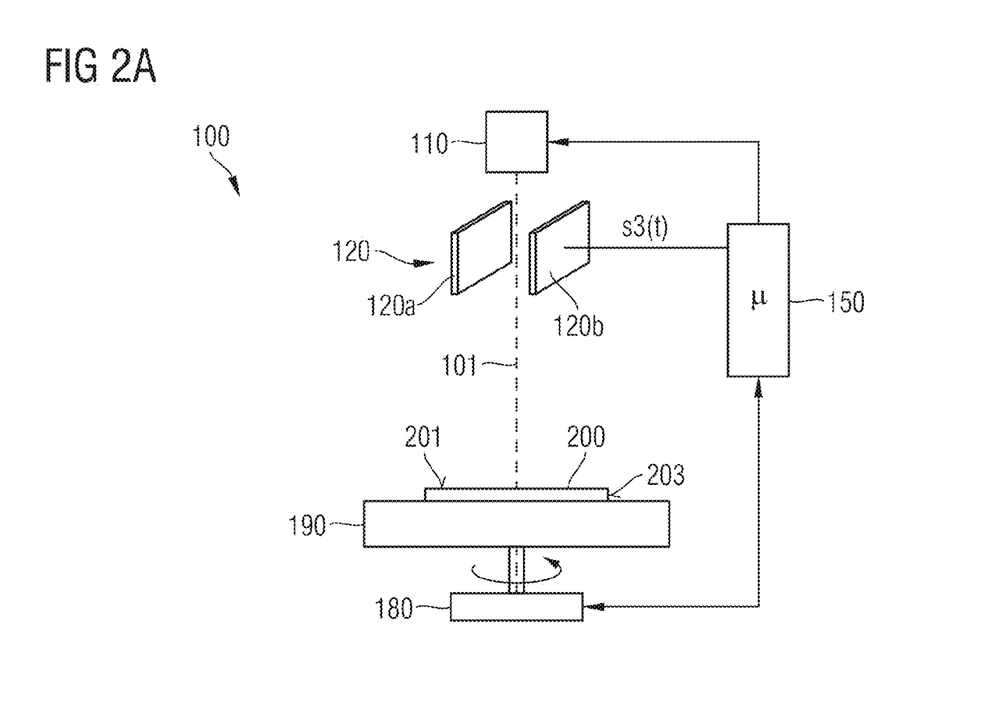
FIG. 2A is a schematic block diagram of an ion implantation apparatus according to an embodiment including a rotating substrate support.

The ion implantation apparatus 100 of FIG. 2A includes an ion beam source 110 emitting an ion beam 101 and an ion beam directing unit 120 that deflects the emitted ion beam 101 along a linear direction, e.g., along the x-axis. The ion beam directing unit 120 may include a deflection unit with two deflection plates 120a, 120b. In addition, a motor drive unit 180 rotates the substrate support 190 around a center point 105 of a substrate 200 fixed on the substrate support 190 in a plane that is perpendicular to the ion beam 101 in its central position or slanted by at most 10 degree, for example by about 7 degree with respect to the plane perpendicular to the ion beam 101 in its center position.

The controller unit 150 may control the ion beam direction unit 120 such that the ion beam 101 moves in a plane spanned by a normal to the process surface 201 or tilted to the normal by a tilt angle of at most 10 degree, for example about 7 degree. In addition, the controller 150 may detect and/or control the rotational speed of the substrate support 190 by monitoring or controlling the motor drive unit 180 whose shaft is coupled to the substrate support 190. Section line 108 indicates the cross-sectional line between the plane in which the ion beam 101 moves and the process surface 201 of the substrate 200. The section line 108 includes the center point 105.

Figure 2B:
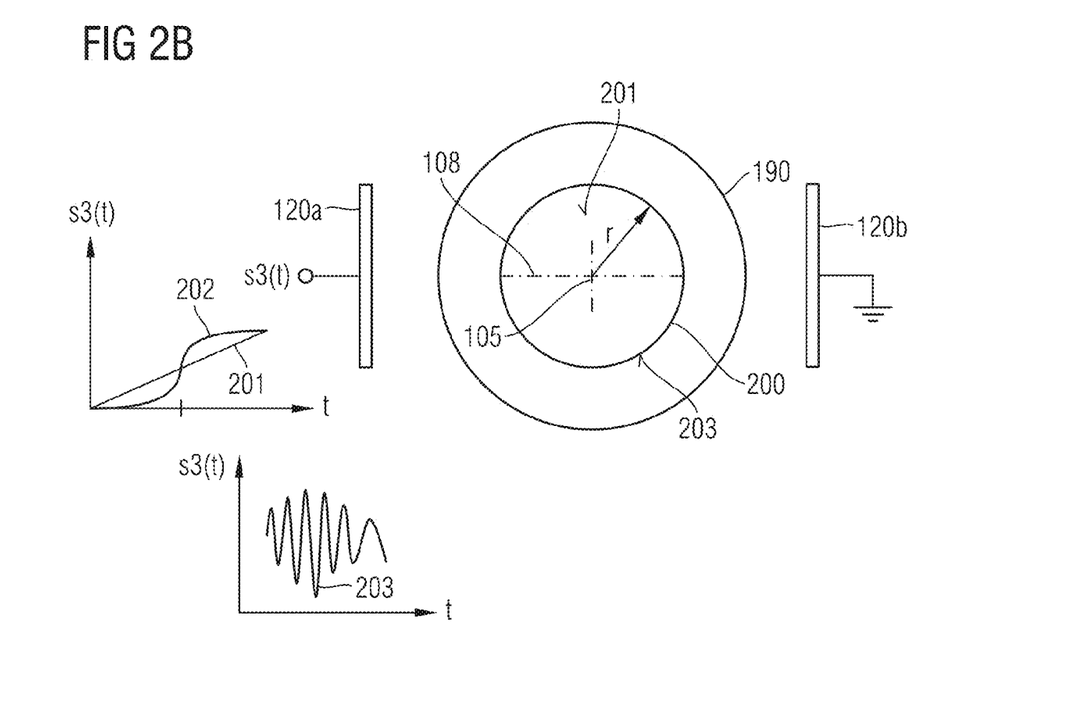
FIG. 2B is a schematic plan view of a substrate for illustrating a cross-sectional line between an ion beam plane and the substrate according to another embodiment.

The deflection signal s3(t) may be a linearly decreasing or increasing signal 201. For a constant rotational speed of the substrate support 190 the deflection signal s3(t) may change only slowly close to the lateral area 203 and faster with decreasing distance to the center point 105 as shown in FIG. 2B. For example, with r indicating the distance to the center point 105 the deflection signal s3(t) may change at a rate 1/r as indicated by signal 202 for achieving a homogeneous impurity distribution.

According to other embodiments the deflection signal s3(t) may be an amplitude modulated periodic signal 203, wherein the frequency of the periodic signal 203 may be lower than the rotational rate of the substrate support 190 also as shown in FIG. 2B. According to an embodiment the rotational rate is at least ten times as high as the linear scan rate of the deflection signal s3(t). During each complete linear scan the ion beam 101 may circulate at least ten times around the center point 105 for achieving a sufficient homogeneous impurity profile.

Figure 3A:
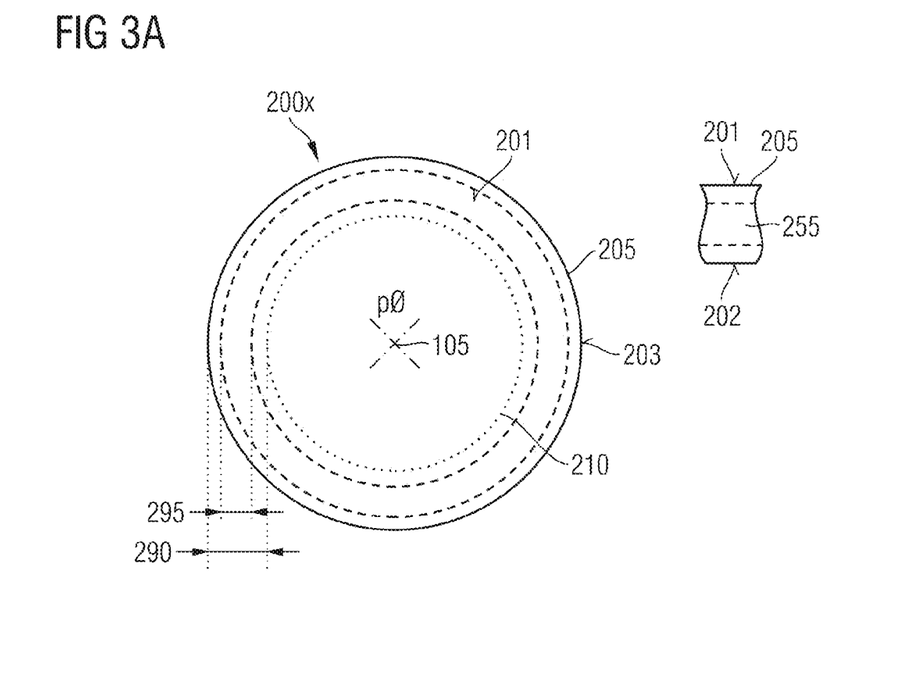
FIG. 3A is a schematic lateral cross-sectional view of a semiconductor device including circular impurity regions according to an embodiment related to charge carrier lifetime adjustment.
Figure 3B:
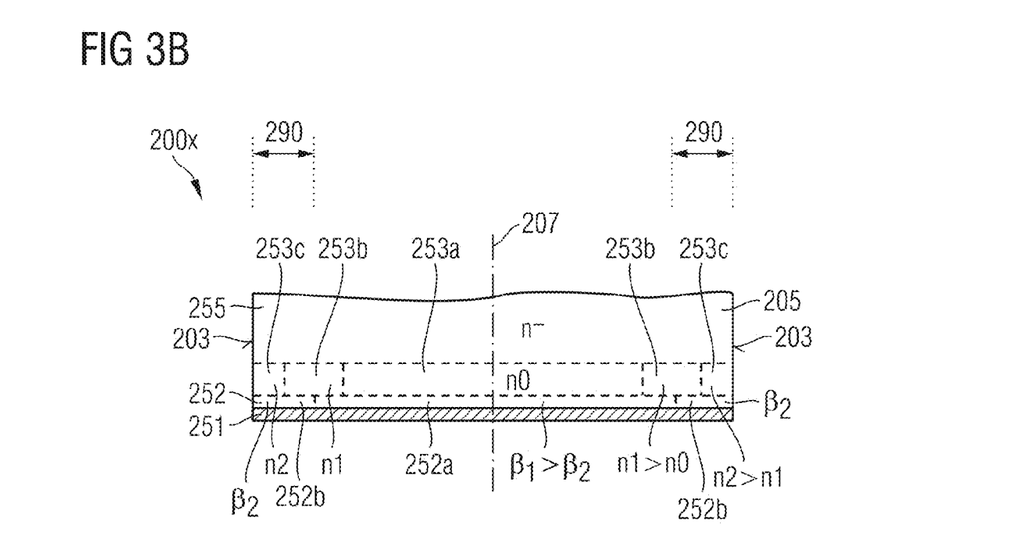
FIG. 3B is a schematic cross-sectional view of a semiconductor device according to an embodiment related to a field stop layer with a circular variation of doping.
Figure 3C:
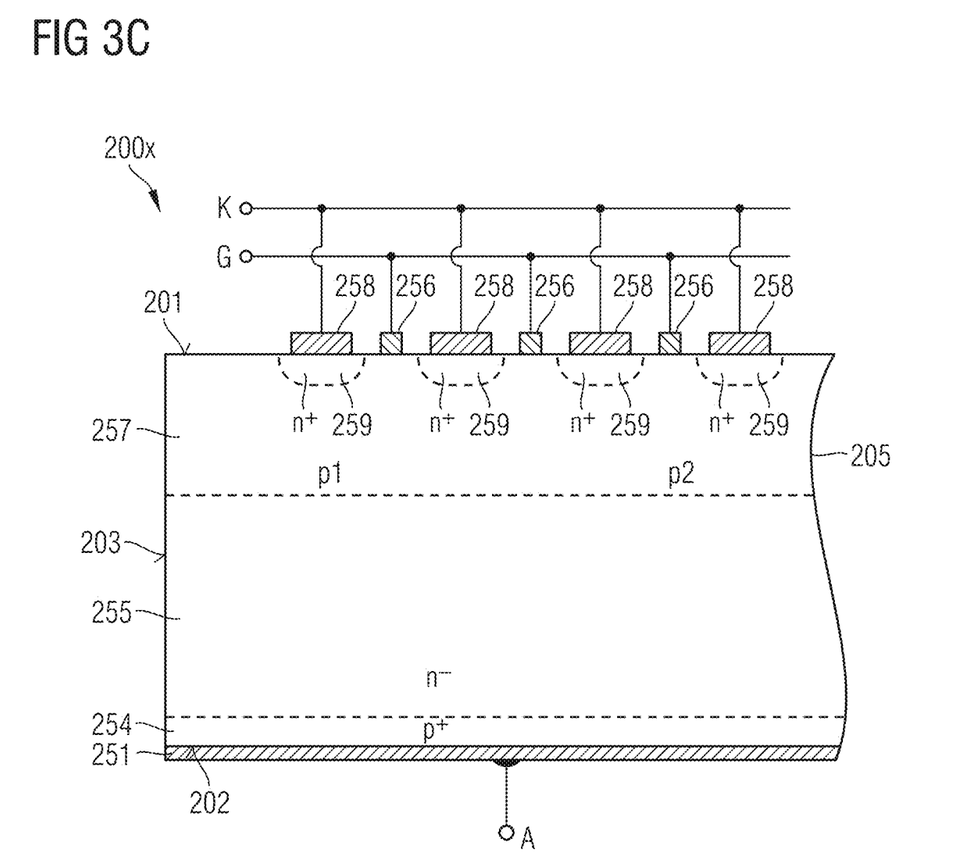
FIG. 3C is a schematic cross-sectional view of a thyristor according to an embodiment related to a compensation of a variation of effective gate resistance.

FIGS. 3A to 3C refer to wafer-scale semiconductor devices 200x obtained by using the ion implantation apparatuses 100 of FIGS. 1A and 2A on circular semiconductor substrates. The wafer-scale semiconductor devices 200x are based on cylindrical semiconductor bodies 205 whose diameter may correspond to a standard wafer diameter, e.g., 25.4 mm, 50.8 mm, 76.2 mm, 100 mm, 125 mm, 150 mm, 200 mm, or 300 mm or any other value greater than 10 mm. A wafer-scale semiconductor device 200x is a single semiconductor die and not integrated in a wafer composite that includes a plurality of identical semiconductor dies.

The semiconductor device 200x of FIG. 3A may be a disc-shaped thyristor or a disc-shaped semiconductor diode with approximately circular lateral base areas 201, 202. In a thyristor on-state or in the forward mode of a semiconductor diode mobile charge carriers flood a drift zone of the semiconductor body between the two opposing base areas 201, 202. When the thyristor changes to an off-state or blocking state or when the semiconductor diode changes to a blocking mode, the respective semiconductor device 200x commutates wherein the mobile charge carriers are removed from the drift zone. Typically an edge area 290 directly adjoining a lateral area 203 connecting the base areas 201, 202 is less effective in removing the mobile charge carriers from the drift zone, because, for example, electrode structures do not reach the lateral area 203.

In the semiconductor device 200x a circular implant of impurities with a radial concentration variation may result in a ring-shaped circular implant zone 295 in the edge area 290 around a center point 105, wherein the circular implant zone 295 may be spaced from the lateral surface 203 or may directly adjoin the lateral surface 203. In the circular implant zone 295 implanted ions such as protons or helium (He) ions may generate particle-induced crystal defects in the silicon crystal lattice. The crystal defects significantly reduce the charge carrier life time in the circular implant zone 295 such that less charge carriers have to be removed from the edge area 290 when the semiconductor device 200x commutates. As a result the dynamic losses in the semiconductor device 200x are lower than without the circular implant zone 295.

The implantation-induced defect concentration in the circular implant zone 295 may continuously or in steps increase in radial direction with increasing distance to the center point 105. Forming the circular implant zone 295 by the circular implantation method described above may save a graded implant mask and may achieve better circular uniformity than unmasked implants based on linear scans.

The semiconductor device 200x of FIG. 3B may be a semiconductor diode or a thyristor including a heavily doped pedestal layer 252 forming an ohmic contact with a metal-containing rear side electrode 251, a low doped drift zone 255 as well as a field stop layer 253 between the low doped drift zone 255 and the pedestal layer 252.

The pedestal layer 252 may have a central portion 252a having a high partial transistor gain around the center axis 207 and a circular outer portion 252b with low partial transistor gain along the lateral area 203. At lower partial transistor gain less charge carriers are injected into the edge area 290 such that less charge carriers have to be removed from the edge area 290 during commutation. Reducing the number of charge carriers during commutation in the edge area 290 also increases the dynamic dielectric strength of the edge area 290 and avalanche breakdown mainly occurs between the edge area 290 and the center axis 207.

The field stop layer 253 may be a circular implant zone with a circular impurity profile including a circular first portion 253a around the center point 105, a circular second portion 253b enclosing and surrounding the first portion 253a and a circular third portion 253c between the second portion 253b and the lateral area 203.

The field stop layer 253 may be formed by circular implantation of ions such as protons that generate circularly-distributed radiation-induced crystal defects. During an anneal at temperatures between 270° C. and 500° C. particle-related donors such as hydrogen-related donors may form at the radiation-induced crystal defects, wherein the hydrogen-related donors may be hydrogen-decorated intrinsic point defect complexes.

In case the semiconductor device 200x is a thyristor, the pedestal and field stop layers 252, 253 form a pn-junction. The impurity concentration in the third portion 253c of the field stop layer 253 is higher than the impurity concentration in the second portion 253b. The impurity concentration in the second portion 253b is higher than the impurity concentration in the first portion 253a. The higher doped portion 253c prevents a depletion zone associated with an avalanche current from a critical punch through to the rear side electrode 251 in the edge area 290.

The circular patterns of the pedestal layer 252 and the field stop layer 253 result in high dynamic robustness and high avalanche current strength.

In case the semiconductor device 200x is a semiconductor diode the pedestal and field stop layers 252, 253 form a unipolar homojunction, e.g. an $nn^+$ or $pp^+$ junction. The impurity concentration in the third portion 253c of the field stop layer 253 is lower than the impurity concentration in the second portion 253b. The impurity concentration in the second portion 253b is lower than the impurity concentration in the first portion 253a. In addition to the impurity concentration, the vertical extensions of the first, second, and third portions 253a, 253b, 253c may be varied.

The circular pattern of the field stop layer 253 may be adjusted to increase the blocking capability in the edge area 290.

In FIG. 3C the semiconductor device 200x is a GTO (gate turn-off) thyristor with a semiconductor body 205 including a p-type pedestal layer 253 effective as anode layer and forming an ohmic contact with a rear side electrode 251 effective as anode electrode, an n-type base layer 255 forming a pn junction with the pedestal layer 253, a p-type base layer 257 forming a pn junction with the n-type base layer 255, and heavily n-type cathode zones 259 forming pn junctions with the p-type base layer 257. On a first base area 201 portions of a cathode electrode 258 form ohmic contacts with the cathode zones 259 and portions of a gate electrode 256 form ohmic contacts with the p-type base layer 257.

When a current supplied through the gate electrode portions 256 exceeds a threshold value, ignition starts close to the respective gate electrode portion 256 and propagates to the center of the cathode zones 259. For turning the GTO off, a negative gate current is supplied through the gate electrode portions 256 and within the p-type base layer 257 holes flow in radial direction to the gate electrode portions 256. The time for switching off a cathode zone 259 depends on the impurity concentration in the p-type base layer 257 and the timing of the gate signal at the gate electrode portions 256. Due to the radial variation of the ohmic line resistance, the gate signal may be delayed between gate electrode portions 256 closer to a supply point of the gate signal and gate electrode portions 256 more distant to the supply point.

A suitable radial variation of a defect concentration with a defect density increasing in radial direction and hence a radial decrease of the charge carrier life time in the n-type base zone 257 may compensate for the radial variation of the effective resistance of the gate metallization and the gate signal propagation delay between ring-shaped gate electrode portions 256. With a defect density increasing in radial direction the cathode zones 259 are switched off within a narrower time span and a maximum current which the thyristor can switch off may be significantly increased.

Generally, a radial variation of defect and/or dopant concentration profiles may be used for a better tradeoff between the static blocking capability of semiconductor devices and the softness of a current gradient during switching off.

FIGS. 4A to 4D refer to embodiments applying a circular ion implantation to semiconductor substrates such as semiconductor wafers.

Silicon semiconductor wafers, e.g., wafers with a diameter of 300 mm, may be obtained from molten silicon using a Czochralski process. A rod with a seed crystal dips into the molten silicon. Single-crystalline silicon crystallizes at the seed crystal and when the rod is slowly pulled out of the melt, the silicon crystal forms a cylindrical ingot which follows the rod. The rod may be rotated during the crystal growth process. M:Cz silicon wafers are obtained from a magnetic Czochralski process using an external magnetic field that suppresses or controls a melt flow in the molten silicon.

Cz and m:Cz wafers may contain interstitial oxygen atoms which in combination with crystal defects may be effective as donors. Typically, a high energetic proton implant is used to generate a homogeneous background donor concentration in at least a partial layer of the semiconductor wafer, e.g. in a layer that corresponds to a lightly doped drift zone of the finalized devices. The implanted protons may interact with the intrinsic oxygen and with crystal defects generated by the implant to generate a doping effective as donors. The intrinsic oxygen distribution in a virgin m:Cz wafer significantly affects the local efficiency of the proton implant as well as the specific ohmic resistance distribution.

It could be demonstrated by the inventors that the Czochralski m:Cz processes result in approximately circular inhomogeneities of the oxygen distribution in the silicon ingot and the semiconductor wafers obtained from the silicon ingot.

Figure 4A:
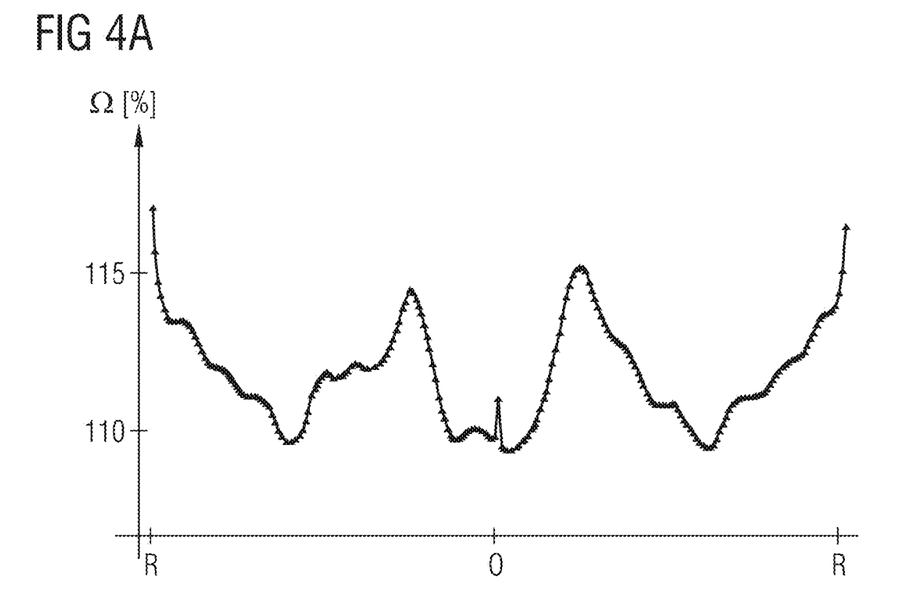
FIG. 4A is a diagram schematically illustrating a lateral profile of the specific resistance of a semiconductor wafer obtained from a Czochralski process for discussing effects of the embodiments.

FIG. 4A shows the specific ohmic resistance distribution in an m:Cz silicon wafer with a radius R. The specific resistance includes maxima and minima in an approximately circular pattern with respect to a center point at r=0. The variation of the specific resistance is about 15% of a mean value in a central region around the center point.

Figure 4B:
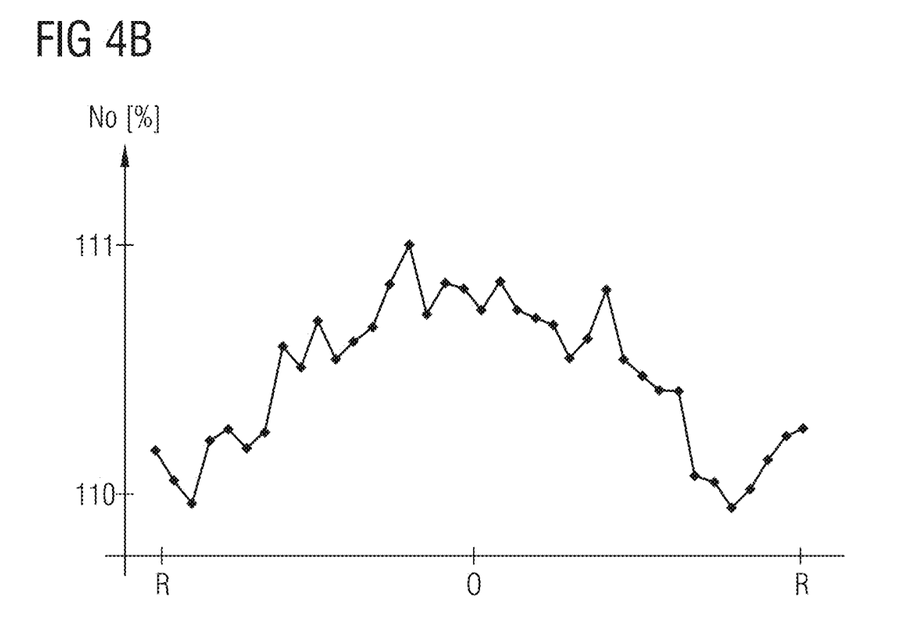
FIG. 4B is a diagram schematically illustrating an intrinsic oxygen distribution across a semiconductor wafer obtained from a Czochralski process for discussing effects of the embodiments.

FIG. 4B schematically shows the intrinsic oxygen density distribution in an m:Cz silicon wafer obtained from an ingot manufactured in a magnetic Czochralski process. The oxygen concentration in a center portion is about 11% higher than along the lateral area of the semiconductor wafer.

Figure 4C:
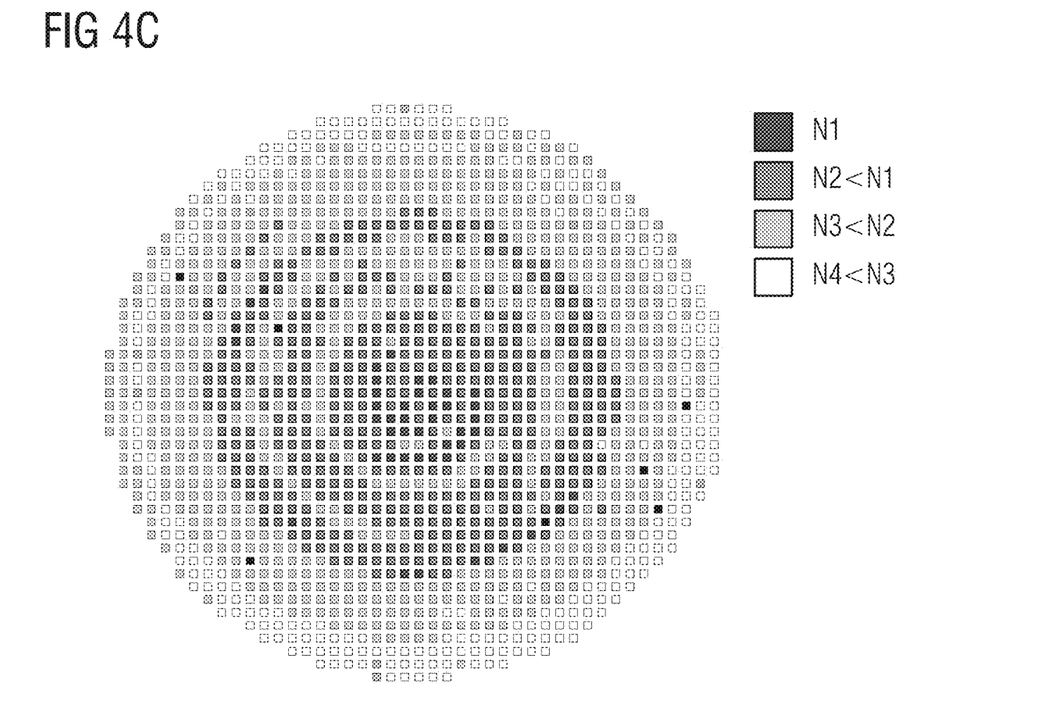
FIG. 4C is a diagram schematically illustrating a charge carrier density in chip areas of a semiconductor wafer obtained from a Czochralski process for discussing effects of the embodiments.

FIG. 4C illustrates rectangles assigned to semiconductor dies obtained from a single m:Cz silicon wafer, wherein dark rectangles indicate high charge carrier concentrations and light rectangles indicate low charge carrier concentrations. Yet at the very beginning of manufacturing, semiconductor dies assigned to different wafer areas differ significantly with respect to the background charge carrier concentration. Though obtained from the same m:Cz silicon wafer, such semiconductor devices obtained from an edge region of the m:Cz silicon wafer may have charge carrier concentrations in low-doped regions, e.g. drift zones, which significantly deviate from the charge carrier concentrations in semiconductor devices obtained from a central region of the same m:Cz silicon wafer. The differences add to the fluctuations in further processes.

Implantation of ions such as protons using a circular regime may compensate for circular distributions of the oxygen distribution. For example, when the semiconductor wafer receives a background impurity concentration, a suitable implant of protons may compensate for the differences in the background concentration.

For conventional ion implanters which typically modify a local impurity profile in an x-y grid a laborious and complex programming compensates for the inherent impurity concentration in the virgin Czochralski wafer. On the other hand, the circular implantation scheme as described above provides a simple and cost-effective method for compensating circular process inhomogeneities introduced, e.g., by the Czochralski process, e.g. in wafers having a diameter of 300 mm and more.

Accordingly, a method of manufacturing semiconductor devices may include pulling a single crystalline silicon ingot from fluidified silicon in a Czochralski process and obtaining, for example by cutting or sawing, semiconductor wafers from the silicon ingot.

The distribution of the resulting effective charge carrier concentration in the semiconductor wafer is determined, for example by measurement, and may be approximated by a circular approximation. Then a compensation profile for compensating the approximated circular impurity distribution may be determined and transferred to the controller unit 150 of the ion implantation apparatus 100 of FIG. 1A or 2A. The background implant is performed, wherein uniformity of the resulting impurity concentration profile of the Czochralski wafer is improved.

Figure 4D:
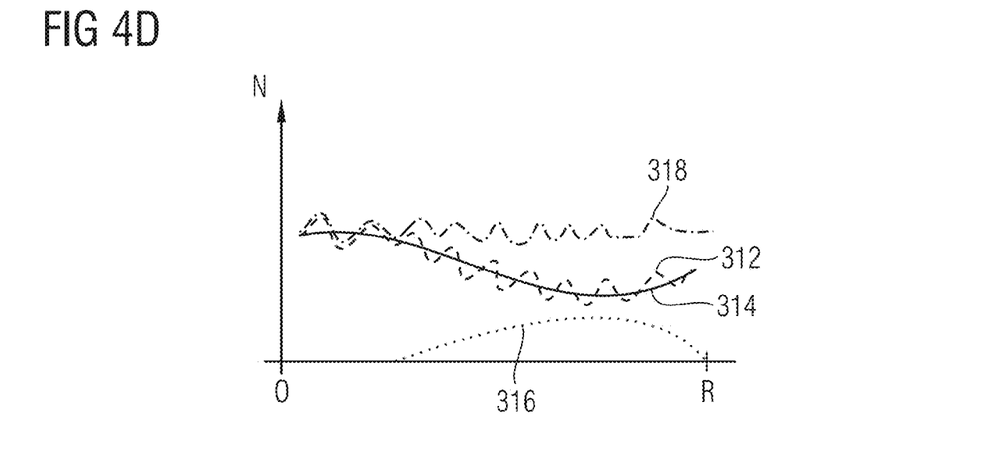
FIG. 4D is a schematic diagram illustrating impurity distributions for illustrating a method of manufacturing semiconductor devices according to a further embodiment.

FIG. 4D schematically shows the radial oxygen distribution 312 in a virgin Czochralski m:Cz silicon wafer, the circular approximation 314, the profile of the compensation implant 316 using protons and the resulting effective donor profile 318. Where the initial oxygen concentration and the concentration of oxygen-induced thermal donors are low, more protons are implanted than where the initial oxygen concentration and the concentration of oxygen-induced thermal donors are high.

The compensation implant 316 forms a circular implant zone containing hydrogen-related donors. A radial concentration variation of the compensation implant 316 around the center point of the semiconductor wafer may compensate to some degree a radial variation of the concentration of the oxygen-induced donors. The resulting effective donor profile 318, which is the sum of the concentrations of the hydrogen-related donors and the oxygen-induced thermal donors, can be tailored such that a variation of the sum of the concentrations is at most 25%, e.g. at most 15% or even below 10%.

The circular implant compensates for effects caused by the oxygen distribution.

Figure 5:
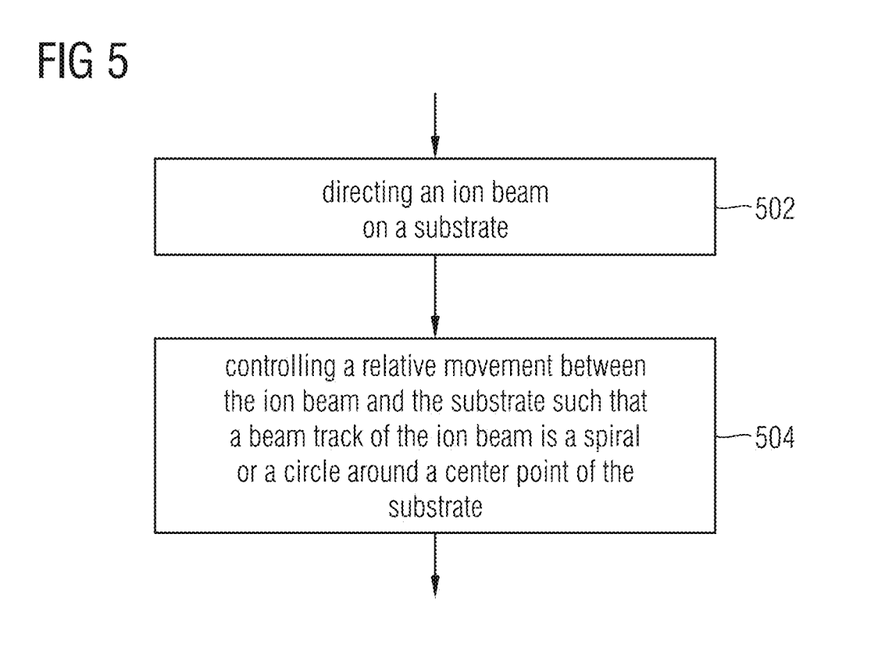
FIG. 5 is a schematic flow chart of an ion implantation method as well as a method of manufacturing semiconductor devices according to other embodiments.

FIG. 5 refers to an ion implantation method as well as to a method of manufacturing a semiconductor device. An ion beam is directed on a substrate (502). A relative movement between the ion beam and the substrate is controlled such that a beam track of the ion beam on a surface of the substrate is a spiral or includes a circle around the center point of the substrate (504).

A method of manufacturing a semiconductor device includes directing an ion beam onto a substrate and controlling a relative movement between the ion beam and the substrate such that a beam track of the ion beam is a spiral or includes circles. A single-crystalline silicon ingot may be pulled out from fluidified silicon and the substrate may be obtained by sawing the silicon ingot orthogonal to its longitudinal axis.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor substrate, comprising:
a circular wafer-scale semiconductor body; and
a circular implant zone with a radial variation of doping around a center point in the semiconductor body, wherein
the circular implant zone is a circular defect zone including hydrogen-related donors with a radial concentration variation around the center point of the semiconductor substrate, and
a variation of a sum of the concentrations of the hydrogen-related donors and oxygen-induced thermal donors is at most 25%.

2. A semiconductor device comprising a semiconductor substrate, the semiconductor substrate comprising:
a circular wafer-scale semiconductor body; and
a circular implant zone with a radial variation of doping around a center point in the semiconductor body, and wherein
the circular implant zone directly adjoins a pedestal layer directly adjoining a base area of the semiconductor body, and
an impurity concentration in the pedestal layer is equal to or greater than a minimum impurity concentration for an ohmic contact between the pedestal layer and a metal-containing electrode directly adjoining the base area.

3. The semiconductor device of claim 2, wherein
the circular implant zone contains radiation-induced dopants.

4. The semiconductor device of claim 2, wherein
the circular implant zone contains doping atoms.

5. The semiconductor device of claim 2, wherein
the circular implant zone directly adjoins a lateral area of the circular semiconductor body.

6. The semiconductor device of claim 2, wherein
the semiconductor device is a gate turn-off thyristor and the circular implant zone is a p-type or n-type base layer.

7. The semiconductor device of claim 2, wherein
a width of the circular implant zone is smaller than a radius of the circular semiconductor body.

* * * * *